United States Patent
Tai et al.

(10) Patent No.: US 8,436,306 B2
(45) Date of Patent: May 7, 2013

(54) PYROELECTRIC ELEMENT

(75) Inventors: Tomoyoshi Tai, Aichi (JP); Kenji Suzuki, Aichi (JP); Jungo Kondo, Aichi (JP)

(73) Assignee: NGK Insulators, Ltd., Aichi-prefecture (JP)

( * ) Notice: Subject to any disclaimer, the term of this patent is extended or adjusted under 35 U.S.C. 154(b) by 0 days.

(21) Appl. No.: 13/638,048

(22) PCT Filed: Oct. 20, 2011

(86) PCT No.: PCT/JP2011/074202
§ 371 (c)(1),
(2), (4) Date: Sep. 28, 2012

(87) PCT Pub. No.: WO2012/114579
PCT Pub. Date: Aug. 30, 2012

(65) Prior Publication Data
US 2013/0020484 A1    Jan. 24, 2013

(30) Foreign Application Priority Data

Feb. 24, 2011 (JP) .................. 2011-037850

(51) Int. Cl.
    *G01J 5/00*  (2006.01)
(52) U.S. Cl.
    USPC .................................................. 250/338.3
(58) Field of Classification Search ..... 250/338.1–338.5
    See application file for complete search history.

(56) References Cited

U.S. PATENT DOCUMENTS 4,940,897 A * 7/1990 Forster et al. .............. 250/338.3
6,121,614 A   9/2000 Taniguchi et al.

FOREIGN PATENT DOCUMENTS

| JP | 06-160194 A | 6/1994 |
| JP | 10-002793 A | 1/1998 |
| JP | 11-230826 A | 8/1999 |
| JP | 2000-164946 A | 6/2000 |
| JP | 2006-203009 A | 8/2006 |

OTHER PUBLICATIONS

International Search Report for PCT Patent App. No. PCT/JP2011/074202 (Dec. 20, 2011).

* cited by examiner

*Primary Examiner* — Kiho Kim
(74) *Attorney, Agent, or Firm* — Cermak Nakajima LLP; Tomoko Nakajima (57) ABSTRACT

A pyroelectric element includes a pyroelectric substrate being a substrate of lithium tantalate single crystal having an X-axis, a Y-axis, and a Z-axis as crystal axes; front-side electrodes disposed on a front side of the pyroelectric substrate; and back-side electrodes paired with the front-side electrodes, respectively. The pyroelectric substrate is a Y-offcut plate obtained by cutting the lithium tantalate single crystal at an angle turned by a cut angle θ from the Y-axis toward the Z-axis about the X-axis that coincides with a direction along the electrode plane, and the cut angle θ is 30° to 60° or 120° to 150°. The pyroelectric substrate is preferably 10 μm or less in thickness, and is more preferably 5 μm to 10 μm in thickness.

3 Claims, 7 Drawing Sheets

Fig. 10

PYROELECTRIC ELEMENT

This application is a national phase entry under 35 U.S.C. §371 of PCT Patent Application No. PCT/JP2011/074202, filed on Oct. 20, 2011, which claims priority under 35 U.S.C. §119 to Japanese Patent Application No. 2011-037850, filed Feb. 24, 2011, and U.S. Provisional Patent Application No. 61/469,885, filed Mar. 31, 2011, all of which are incorporated by reference.

TECHNICAL FIELD

The present invention relates to a pyroelectric element.

BACKGROUND ART

Pyroelectric elements have been used as infrared detectors for security and gas detection purposes. A pyroelectric element includes a pyroelectric substrate and a pair of electrodes disposed on front and back sides of the pyroelectric substrate. Irradiating a surface of the pyroelectric element with infrared light increases the temperature of the pyroelectric substrate. The change in temperature changes the spontaneous polarization, disturbs the balance of electric charge on the surface of the pyroelectric substrate, and causes generation of electric charge. The infrared light is detected by extracting the generated electric charge through conductive lines connected to the pair of electrodes.

A pyroelectric element is known which includes a pyroelectric substrate made of lithium tantalate ($LiTaO_3$, hereinafter may be abbreviated as "LT") that has a large pyroelectric coefficient and a high performance index (see, e.g., Patent Document 1). The pyroelectric substrate made of LT suffers the problem of occurrence of sudden noise called popcorn noise. The popcorn noise is considered to be caused by discharge of electric charge which is accumulated on the surface of the pyroelectric substrate and increased in voltage to a high level. Some techniques have been developed to suppress the occurrence of popcorn noise (see, e.g., Patent Documents 2 and 3). Patent Document 2 describes a technique in which the surrounding of a light-receiving section is removed on three sides to suppress stress concentration caused by application of thermal change, and thus the occurrence of popcorn noise can be significantly reduced. Patent Document 3 describes a technique in which when the volume resistivity of a pyroelectric substrate is set to $1\times10^{10}$ Ωcm to $1\times10^{13}$ Ωcm, since the voltage on the surface of the pyroelectric substrate is not increased to a high level and the occurrence of discharge can be suppressed, the occurrence of popcorn noise can be reduced. This is because even if a change in temperature causes generation of electric charge, the generated electric charge passes through the pyroelectric substrate and disappears quickly.

Patent Document 1: Japanese Unexamined Patent Application Publication No. 6-160194
Patent Document 2: Japanese Unexamined Patent Application Publication No. 10-2793
Patent Document 3: Japanese Unexamined Patent Application Publication No. 2006-203009

DISCLOSURE OF INVENTION

However, in the technique described in Patent Document 2 where the pyroelectric substrate is partially removed by sandblasting, the number of steps is increased and there are variations in sensitivity caused by variations in processing. In the technique described in Patent Document 3 where the volume resistivity is set to be small, there is degradation in pyroelectricity and sensitivity. It is thus required to easily suppress the occurrence of popcorn noise. Moreover, even if the occurrence of popcorn noise can be suppressed, it is not desirable in practice that there will be a significant degradation in S/N ratio. Therefore, it is also required to suppress degradation in S/N ratio.

The present invention has been made to solve the problems described above. A primary object of the present invention is to easily suppress occurrence of popcorn noise without significantly degrading the S/N ratio.

Studies by the present inventors have revealed that although a Z-plate having a large pyroelectric coefficient (i.e., an LT substrate having an electrode plane whose normal direction coincides with the Z-axis of a single crystal) has been conventionally used when an LT substrate is used as a pyroelectric substrate, the large pyroelectric coefficient causes the occurrence of popcorn noise. Then, the studies have found that if an LT single-crystal Y-offcut plate having a predetermined cut angle, instead of a Z-plate, is used as a pyroelectric substrate, it is possible to suppress not only the occurrence of popcorn noise, but also the degradation in S/N ratio. This has led to the completion of the present invention.

A pyroelectric element of the present invention comprises a pyroelectric substrate being a substrate of lithium tantalate single crystal having an X-axis, a Y-axis, and a Z-axis as crystal axes; and a pair of electrodes disposed on front and back sides of the pyroelectric substrate, wherein the pyroelectric substrate is a Y-offcut plate obtained by cutting the lithium tantalate single crystal at an angle turned by a cut angle θ from the Y-axis toward the Z-axis about the X-axis that coincides with a direction along the electrode plane, and the cut angle θ is 30° to 60° or 120° to 150°.

The cut angle θ is typically set in the range of 0° to 180°. A substrate having a cut angle θ of 90° is one having a surface whose normal direction coincides with the Z-axis. This substrate will be referred to as a Z-plate. A substrate having a cut angle θ of 0° or 180° is one having a surface whose normal direction coincides with the Y-axis. This substrate will be referred to as a Y-plate. A substrate having a cut angle θ in the range of 0°<θ<90° or 90°<θ<180° will be referred to as a Y-offcut plate. An LT single-crystal pyroelectric substrate, in which pyroelectric charge is generated in the Z-axis direction, has the largest pyroelectric coefficient if it is a Z-plate having an electrode plane whose normal direction coincides with the Z-axis, and has a pyroelectric coefficient smaller than that of the Z-plate if it is a Y-offcut plate. If the cut angle θ of the Y-offcut plate is in the range of 0°<θ<90°, the smaller the cut angle θ, the larger the angle formed by the normal direction of the electrode plane and the Z-axis and the smaller the pyroelectric coefficient. If the cut angle θ of the Y-offcut plate is in the range of 90°<θ<180°, the larger the cut angle θ, the larger the angle formed by the normal direction of the electrode plane and the Z-axis and the smaller the pyroelectric coefficient.

The studies by the present inventors have found that when the cut angle θ is in the range of 0°<θ<90°, the occurrence of popcorn noise can be suppressed if the cut angle θ is 60° or less. That is, if the pyroelectric coefficient is less than or equal to that obtained when the cut angle θ is 60°, the occurrence of popcorn noise can be suppressed. This result indicates that when the cut angle θ is in the range of 90°<θ<180°, the occurrence of popcorn noise can be suppressed if the cut angle θ is 120° or more. This is because since the angle formed by the normal direction of the electrode plane and the Z-axis when the cut angle θ is 60° is the same as that when the cut angle θ is 120°, the pyroelectric coefficients in both cases are the same. The studies have also found that when the cut angle θ is in the range of 0°<θ<90° and if the cut angle θ is 30° or more, the S/N ratio can be maintained at or above 50% of that obtained when a Z-plate having a thickness of 40 μm or more is used. This result indicates that when the cut angle θ is in the range of 90°<θ<180° and if the cut angle θ is 150° or less, the S/N ratio can be maintained at or above 50% of that obtained when a Z-plate having a thickness of 40 μm or more is used. In summary, if the cut angle θ is in the range of 30° to 60° or in the range of 120° to 150°, it is possible to suppress both the occurrence of popcorn noise and the degradation in S/N ratio.

In the pyroelectric element of the present invention, the thickness of the Y-offcut plate is preferably 10 μm or less (e.g., 1 μm to 10 μm). When the thickness of the Y-offcut plate is 1 μm to 10 μm, the S/N ratio is constant and substantially the same as that in the case of the Z-plate. If the thickness of the Y-offcut plate exceeds 10 μm, the S/N ratio shows a tendency to decrease as the thickness increases. If the thickness of the Y-offcut plate is in the range of 5 μm to 100 μm, the voltage sensitivity is substantially constant and slightly smaller than that in the case of the Z-plate. If the thickness of the Y-offcut plate is less than 5 μm, the voltage sensitivity shows a tendency to decrease as the thickness decreases.

BEST MODES FOR CARRYING OUT THE INVENTION

First Embodiment

Figure 1:
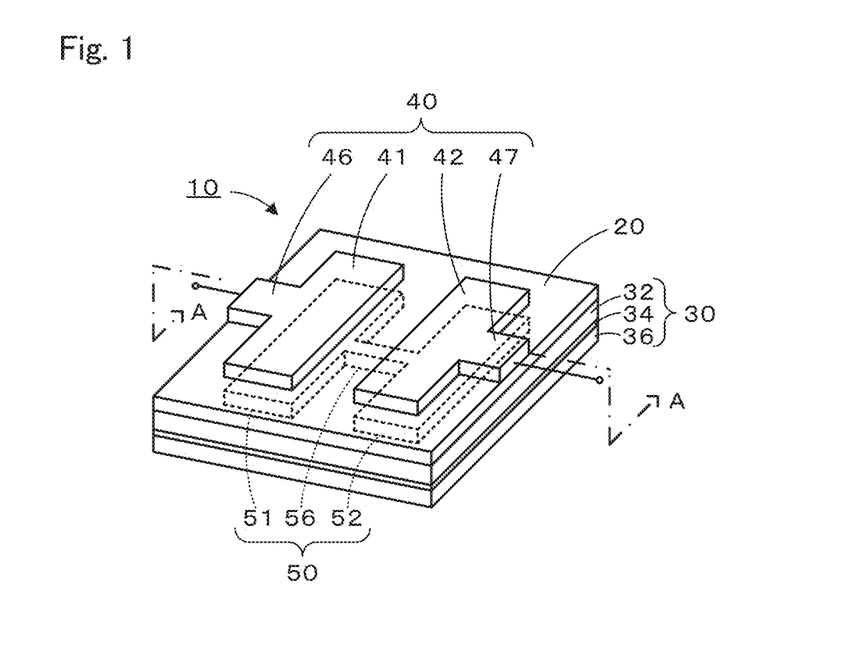
FIG. 1 is a schematic perspective view of a pyroelectric element 10 according to a first embodiment.
Figure 2:
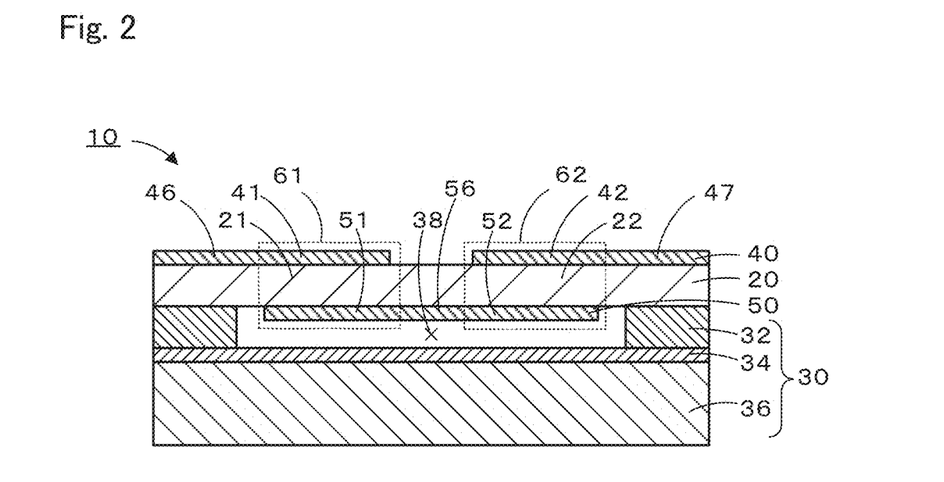
FIG. 2 is a cross-sectional view taken along line A-A of FIG. 1.
Figure 3:
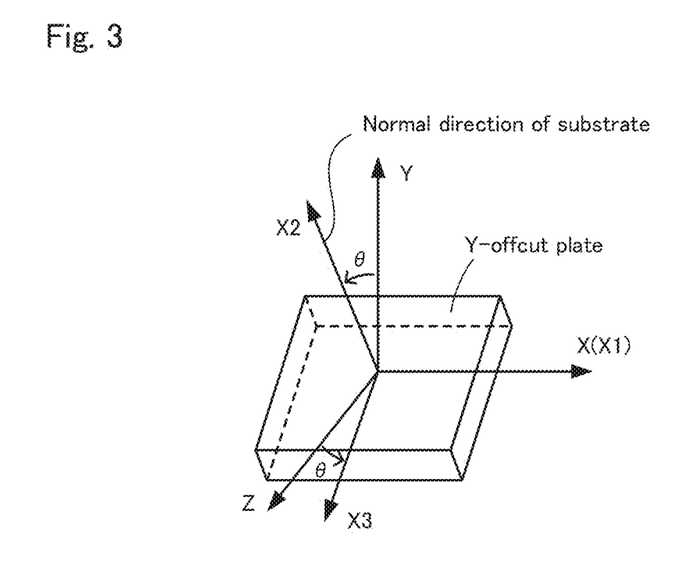
FIG. 3 illustrates a cut angle of a Y-offcut plate used as a pyroelectric substrate 20.

FIG. 1 is a schematic perspective view of a pyroelectric element 10 according to a first embodiment. FIG. 2 is a cross-sectional view taken along line A-A of FIG. 1. FIG. 3 illustrates a cut angle of a Y-offcut plate used as a pyroelectric substrate 20.

The pyroelectric element 10 is configured as a dual-type pyroelectric element that includes two light-receiving sections 61 and 62 (see FIG. 2). The pyroelectric element 10 includes the pyroelectric substrate 20, a supporting member 30 configured to support the pyroelectric substrate 20, a front-side metal layer 40 disposed on a front side of the pyroelectric substrate 20, and a back-side metal layer 50 disposed on a back side of the pyroelectric substrate 20.

The pyroelectric substrate 20 is a substrate of LT single crystal having an X-axis, a Y-axis, and a Z-axis as crystal axes. As illustrated in FIG. 3, the pyroelectric substrate 20 is a Y-offcut plate obtained by cutting the LT single crystal at an angle turned by the cut angle θ from the Y-axis toward the Z-axis about the X-axis that coincides with a direction along the substrate surface (electrode plane). In this Y-offcut plate, when X1 represents a direction along the electrode plane, X2 represents a direction normal to the electrode plane, and X3 represents an axis orthogonal to both X1 and X2, then X1 coincides with the X-axis, X2 is an axis turned by the cut angle θ from the Y-axis toward the Z-axis about the X-axis, and X3 is an axis turned by the cut angle θ from the Z-axis in accordance with the turning of X2. The cut angle θ is set in the range of 30° to 60° or in the range of 120° to 150°. It is known that the closer the angle formed by X2 and the Z-axis (90°−θ) is to zero, or the closer the cut angle θ is to 90°, the larger the pyroelectric coefficient. The pyroelectric coefficient of a Y-offcut plate having the cut angle θ is equal in absolute value to that of a Y-offcut plate having a cut angle of (180°−θ), because the angle formed by X2 and the Z-axis is (90°−θ) in both of the Y-offcut plates. The thickness of the pyroelectric substrate 20 is 10 μm or less (e.g., 0.1 μm to 10 μm), preferably 1 μm to 10 μm, and more preferably 5 μm to 10 μm. The size of the pyroelectric substrate 20 is, for example, 0.1 mm to 5 mm in length and 0.1 mm to 5 mm in width.

The supporting member 30 includes a supporting layer 32, a bonding layer 34, and a supporting substrate 36. The supporting layer 32 is formed on the back side of the pyroelectric substrate 20 to support the pyroelectric substrate 20. Examples of the material of the supporting layer 32 include silicon dioxide. The thickness of the supporting layer 32 is not particularly limited, but is, for example, 0.1 μm to 1 μm. The bonding layer 34 is configured to bond the supporting layer 32 to the supporting substrate 36. The bonding layer 34 is formed over the entire front side of the supporting substrate 36. Examples of the material of the bonding layer 34 include a hardened epoxy adhesive and a hardened acrylic adhesive. The thickness of the bonding layer 34 is not particularly limited, but is, for example, 0.1 μm to 1 μm. Besides the adhesive, anode bonding or direct bonding may be used as a bonding method. The supporting substrate 36 is a plate-like substrate bonded to the supporting layer 32, with the bonding layer 34 interposed therebetween. Examples of the material of the supporting substrate 36 include glass, LT, and lithium niobate (LN). The size of the supporting substrate 36 is not particularly limited, but is, for example, 0.1 mm to 5 mm in length, 0.1 mm to 5 mm in width, and 0.15 mm to 0.5 mm in thickness. The supporting layer 32, the bonding layer 34, and the supporting substrate 36 are preferably made of materials having thermal conductivities lower than that of the material of the pyroelectric substrate 20. As illustrated in FIG. 2, the supporting member 30 is provided with a cavity 38, which is rectangularly surrounded by the supporting layer 32. That is, the supporting layer 32 is configured to support the pyroelectric substrate 20 from the back side in an area other than the cavity 38.

The front-side metal layer 40 is formed on the front side of the pyroelectric substrate 20. The front-side metal layer 40 includes two rectangular front-side electrodes 41 and 42 longitudinally extending in plan view, a lead portion 46 electrically connected to the front-side electrode 41 and square in plan view, and a lead portion 47 electrically connected to the front-side electrode 42 and square in plan view. Examples of the material of the front-side metal layer 40 include metals, such as nickel, chromium, and gold. Materials with higher infrared absorptivity are more preferable. The thickness of the front-side metal layer 40 is not particularly limited, but is, for example, 0.01 μm to 0.2 μm. The front-side metal layer 40 may have a double-layer structure composed of a metal layer of chromium formed on the front side of the pyroelectric substrate 20 and a metal layer of nickel formed on the metal layer of chromium.

The back-side metal layer 50 is formed on the back side of the pyroelectric substrate 20. The back-side metal layer 50 includes two rectangular back-side electrodes 51 and 52 longitudinally extending in plan view, and a rectangular lead portion 56 electrically connecting the back-side electrodes 51 and 52 and laterally extending in plan view. The material of the back-side metal layer 50 can be the same as that of the front-side metal layer 40 described above. The thickness of the back-side metal layer 50 is not particularly limited, but is, for example, 0.01 μm to 0.2 μm. The back-side electrodes 51 and 52 on the back side of the pyroelectric substrate 20 are located opposite the front-side electrodes 41 and 42, respectively.

The light-receiving section 61 is formed by a pair of electrodes (front-side electrode 41 and back-side electrode 51) and a light-receiving portion 21 of the pyroelectric substrate 20 interposed between the front-side electrode 41 and the back-side electrode 51. Similarly, the light-receiving section 62 is formed by a pair of electrodes (front-side electrode 42 and back-side electrode 52) and a light-receiving portion 22 of the pyroelectric substrate 20 interposed between the front-side electrode 42 and the back-side electrode 52. In the light-receiving sections 61 and 62, a voltage between the pair of electrodes changes when the temperature is changed by irradiation of infrared light. For example, when the light-receiving section 61 is irradiated with infrared light, the front-side electrode 41 and the light-receiving portion 21 absorb the infrared light. This causes a change in temperature. Then, the resulting change in spontaneous polarization in the light-receiving portion 21 appears as a change in voltage between the front-side electrode 41 and the back-side electrode 51. The front-side electrodes 41 and 42 may be gold black films having a high infrared absorptivity. A gold black film is a gold film deposited on fine particles.

Figure 4:
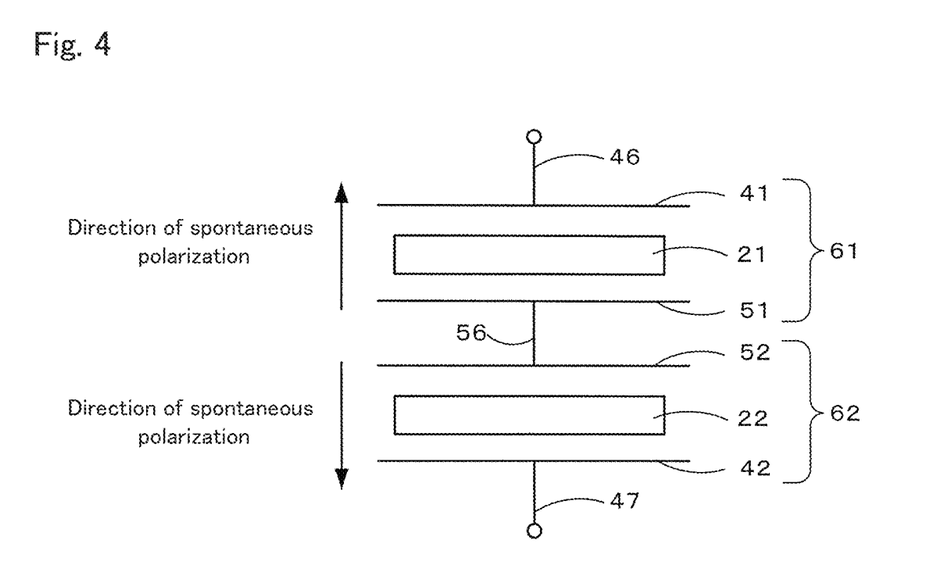
FIG. 4 is a circuit diagram illustrating how light-receiving sections 61 and 62 of the pyroelectric element 10 are electrically connected.

The operation of the pyroelectric element 10 configured as described above will now be described. FIG. 4 is a circuit diagram illustrating how the light-receiving sections 61 and 62 of the pyroelectric element 10 are electrically connected. As illustrated, the light-receiving sections 61 and 62 of the pyroelectric element 10 are connected, in series, by connection of the back-side electrodes 51 and 52 through the lead portion 56. A voltage between the front-side electrodes 41 and 42 at both ends of the serially-connected circuit can be extracted as a voltage between the lead portions 46 and 47. In the present embodiment, the directions of spontaneous polarization in the light-receiving portions 21 and 22 are opposite each other in FIG. 4 (whereas they are the same in FIG. 2). In the pyroelectric element 10, where the pyroelectric substrate 20 is made of pyroelectric material, spontaneous polarization always takes place in the light-receiving portions 21 and 22 even under normal conditions. However, since the light-receiving sections 61 and 62 absorb floating electric charge in the air to be electrically balanced with the spontaneous polarization, apparent electric charge is zero in both the light-receiving portions 21 and 22. Therefore, since no voltage is generated between the front-side electrode 41 and the back-side electrode 51 and between the front-side electrode 42 and the back-side electrode 52 under normal conditions, no voltage is generated between the lead portions 46 and 47. If a change in the amount of infrared light in the atmosphere surrounding the pyroelectric element 10 (e.g., a change in ambient temperature) causes the temperatures of the light-receiving portions 21 and 22 to change in the same manner, a change in spontaneous polarization occurs in both the light-receiving portions 21 and 22. This results in an imbalance of electric charge and causes voltages of equal magnitude to be generated between the front-side electrode 41 and the back-side electrode 51 and between the front-side electrode 42 and the back-side electrode 52. However, since the directions of spontaneous polarization in the light-receiving portions 21 and 22 are opposite each other as illustrated in FIG. 4, the voltages cancel out each other and again no voltage is generated between the lead portions 46 and 47. Thus, the pyroelectric element 10 is a dual-type element in which the light-receiving sections 61 and 62 are connected in series such that the directions of spontaneous polarization are opposite each other. Therefore, not only under normal conditions but also when there is a change in the amount of infrared light in the atmosphere surrounding the pyroelectric element 10, no voltage is generated between the lead portions 46 and 47 and a malfunction caused by noise is less likely to occur. On the other hand, for example, when someone passes by the pyroelectric element 10 and the light-receiving sections 61 and 62 are irradiated with different amounts of infrared light, the temperatures of the light-receiving portions 21 and 22 are changed by different amounts. Because of these temperature changes, a voltage generated between the front-side electrode 41 and the back-side electrode 51 is different from a voltage generated between the front-side electrode 42 and the back-side electrode 52. Since these voltages do not completely cancel out each other, a voltage is generated between the lead portions 46 and 47. Thus, the pyroelectric element 10 can be used as an infrared detector for human detection, fire detection, etc. When the pyroelectric element 10 is used as an infrared detector, for example, a voltage between the lead portions 46 and 47 can be amplified by connecting the lead portions 46 and 47 to a field-effect transistor (FET) for impedance conversion. The front-side electrodes 41 and 42 may be covered with an infrared absorbing layer of gold black to improve the infrared absorption efficiency. To prevent a malfunction caused by noise, the front-side electrodes 41 and 42 may be provided with a wavelength filter that allows light of only a specific wavelength to reach the light-receiving portions 21 and 22.

Figure 5:
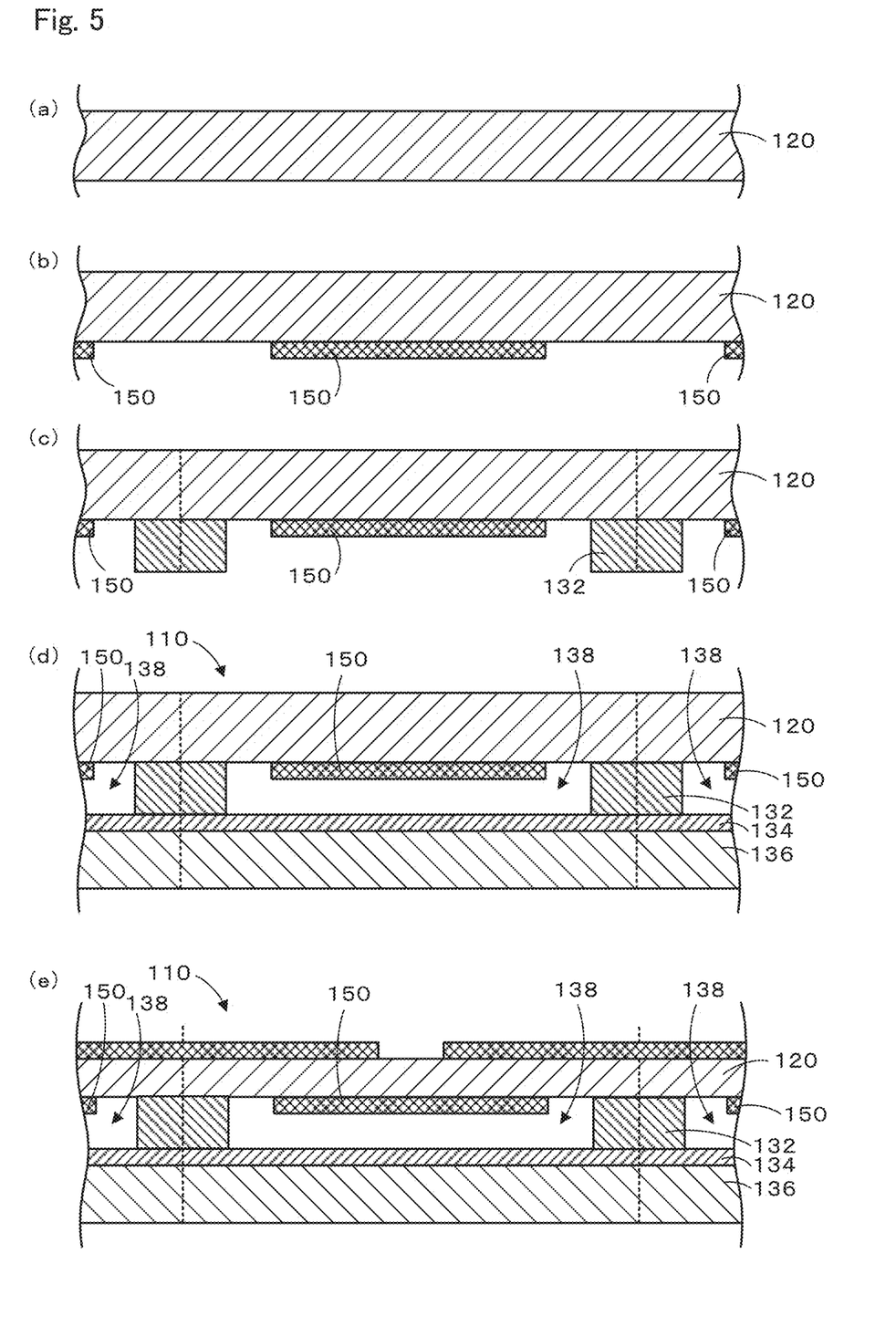
FIG. 5 is a cross-sectional view schematically illustrating steps of manufacturing the pyroelectric element 10.

A method for manufacturing the pyroelectric element 10 will now be described. FIG. 5 is a cross-sectional view schematically illustrating steps of manufacturing the pyroelectric element 10. First, a flat pyroelectric substrate 120 to be turned into individual pyroelectric substrates 20 is prepared (see FIG. 5(a)). For example, the pyroelectric substrate 120 is a wafer that has an orientation flat (OF) and is large enough to allow a plurality of pyroelectric substrates 20 to be cut out therefrom. The material of the pyroelectric substrate 120 can be the same as that of the pyroelectric substrate 20 described above. The size of the pyroelectric substrate 120 is not particularly limited, but is, for example, 50 mm to 100 mm in diameter and 200 μm to 1 mm in thickness.

Next, back-side metal layers 150 to be turned into individual back-side metal layers 50 are formed on the back side of the pyroelectric substrate 120 (see FIG. 5(b)). The back-side metal layers 150 are obtained by forming a pattern, which is to be turned into a plurality of back-side metal layers 50, on the back side of the pyroelectric substrate 120. The material of the back-side metal layers 150 can be the same as that of the back-side metal layer 50 described above. The thickness of the back-side metal layers 150 is not particularly limited, but is, for example, 0.01 μm to 0.2 μm. The back-side metal layers 150 can be formed, for example, by vacuum evaporation using a metal mask that covers the pyroelectric substrate 120 except for areas of the back-side metal layers 150. The back-side metal layers 150 may be formed by sputtering, photolithography, or screen printing.

Next, supporting layers 132 to be turned into individual supporting layers 32 are formed on the back side of the pyroelectric substrate 120 (see FIG. 5(c)). The supporting layers 132 are obtained by forming a pattern, which is to be turned into a plurality of supporting layers 32, on the back side of the pyroelectric substrate 120 such that cavities 38 are created. The positional relationship between the back-side metal layers 150 and the supporting layers 132 is the same as that between the back-side metal layer 50 and the supporting layer 32 illustrated in FIG. 1 and FIG. 2. The material of the supporting layers 132 can be the same as that of the supporting layer 32 described above. The thickness of the supporting layers 132 is not particularly limited, but is, for example, 0.1 µm to 1 µm. The supporting layers 132 are formed, for example, in the following manner. First, a layer to be turned into the supporting layers 132 is formed by sputtering over the entire back side of the pyroelectric substrate 120. Next, a resist film serving as an etching mask is formed on the layer by photolithography only at portions to be left as the supporting layers 132. Then, portions not covered by the etching mask (i.e., the portions to be turned into individual cavities 38) are removed by etching. The supporting layers 132 are thus formed.

Next, a supporting substrate 136 to be turned into individual supporting substrates 36 is prepared. An adhesive for forming bonding layers 34 is applied to the front side of the supporting substrate 136 and/or the back sides of the supporting layers 132. After the front side of the supporting substrate 136 is bonded to the back sides of the supporting layers 132, the adhesive is cured to form a bonding layer 134 (see FIG. 5(d)). Thus, a composite body 110 can be obtained, which includes the pyroelectric substrate 120, the back-side metal layers 150, the supporting layers 132, the bonding layer 134, and the supporting substrate 136 and has cavities 138 to be turned into individual cavities 38. The material of the bonding layer 134 can be the same as that of the bonding layer 34 described above. The thickness of the bonding layer 134 is not particularly limited, but is, for example, 0.1 µm to 1 µm.

In the composite body 110, the front side of the pyroelectric substrate 120 is ground until the pyroelectric substrate 120 reaches a predetermined thickness. Then, front-side metal layers 140 to be turned into individual front-side metal layers 40 are formed on the front side of the pyroelectric substrate 120 (see FIG. 5(e)). The front-side metal layers 140 are obtained by forming a pattern, which is to be turned into a plurality of front-side metal layers 40, on the front side of the pyroelectric substrate 120. The front-side metal layers 140 are formed such that portions thereof to be turned into the front-side electrodes 41 and 42 are paired with respective portions to be turned into the back-side electrodes 51 and 52. The material of the front-side metal layers 140 can be the same as that of the front-side metal layer 40 described above. The thickness of the front-side metal layers 140 is not particularly limited, but is, for example, 0.01 µm to 0.2 µm. The front-side metal layers 140 can be formed in the same manner as the back-side metal layers 150. The composite body 110 thus is a collection of many pyroelectric elements 10.

Then, individual pyroelectric elements 10 are cut out of the composite body 110 having the front-side metal layers 140 formed thereon. Thus, a plurality of pyroelectric elements 10, one of which is illustrated in FIG. 1 and FIG. 2, can be obtained.

A pyroelectric coefficient of an LT substrate will now be described. An LT substrate, in which pyroelectric charge is generated in the Z-axis direction, has the largest pyroelectric coefficient if it is a Z-plate having an electrode plane whose normal direction coincides with the Z-axis, and has a pyroelectric coefficient smaller than that of the Z-plate if it is a Y-offcut plate. If the cut angle θ of the Y-offcut plate is in the range of 0°<θ<90°, the smaller the cut angle θ, the larger the angle formed by the normal direction of the electrode plane and the Z-axis and the smaller the pyroelectric coefficient. If the cut angle θ of the Y-offcut plate is in the range of 90°<θ<180°, the larger the cut angle θ, the larger the angle formed by the normal direction of the electrode plane and the Z-axis and the smaller the pyroelectric coefficient. A pyroelectric coefficient p can be expressed by the following equation (1):

$$p=(\Delta Q/\Delta T)\times(1/S) \qquad (1)$$

where ΔQ is the amount of change in electric charge, ΔT is the amount of change in temperature, and S is the area.

The studies by the present inventors have found that when the cut angle θ of the Y-offcut plate used as the pyroelectric substrate 20 is in the range of 0°<θ<90°, the occurrence of popcorn noise can be suppressed if the cut angle θ is 60° or less. That is, if the pyroelectric coefficient is less than or equal to that obtained when the cut angle θ is 60°, the occurrence of popcorn noise can be suppressed. This result indicates that when the cut angle θ is in the range of 90°<θ<180°, the occurrence of popcorn noise can be suppressed if the cut angle θ is 120° or more. This is because since the angle formed by the normal direction of the electrode plane and the Z-axis when the cut angle θ is 60° is the same as that when the cut angle θ is 120°, the pyroelectric coefficients in both cases are the same. The studies have also found that when the cut angle θ is in the range of 0°<θ<90° and if the cut angle θ is 30° or more, the S/N ratio can be maintained at or above 50% of that obtained when a Z-plate of the same thickness is used. This result indicates that when the cut angle θ is in the range of 90°<θ<180° and if the cut angle θ is 150° or less, the S/N ratio can be maintained at or above 50% of that obtained when a Z-plate of the same thickness is used. In summary, if the cut angle θ is in the range of 30° to 60° or in the range of 120° to 150°, it is possible to suppress both the occurrence of popcorn noise and the degradation in S/N ratio. At the time when U.S. Provisional Patent Application No. 61/469,885 on which the present application is based was filed, the pyroelectric coefficient p was calculated by the equation (1) on the assumption that in a known equation Q=CV (where C is capacitance and V is voltage), the capacitance C is a constant and the amount of change in electric charge ΔQ is proportional to the amount of change in surface potential ΔV. Then, it was determined that if the cut angle θ is in the range of 30° to 60° or in the range of 120° to 150°, the pyroelectric coefficient p can be maintained at about 80% of that of the Z-plate. However, subsequent studies have found that the capacitance C is not a constant and varies with the cut angle θ (e.g., sin θ or $\sin^2$ θ) and that the pyroelectric coefficient p may be less than 80% of that of the Z-plate. Although it has not yet determined how the pyroelectric coefficient p varies with the cut angle θ, it is estimated that the capacitance C is likely to be the function of sin θ.

In the pyroelectric element 10 described in detail above, a Y-offcut plate made of LT single crystal and having a cut angle θ of 30° to 60° or 120° to 150° is used as the pyroelectric substrate 20. Therefore, it is possible to suppress the occurrence of popcorn noise and the degradation in S/N ratio. At the same time, since the thickness of the Y-offcut plate is 10 µm or less (e.g., 1 µm to 10 µm), it is possible to further improve the S/N ratio.

The pyroelectric element 10 is suitable for mass production because it can be manufactured using a large-sized LT substrate which is 4 inches in diameter. An LT single crystal is pulled up and grown by the Czochralski process. If the cut angle θ is 30° to 48°, the LT single crystal can be pulled up when it reaches 4 inches in diameter. Therefore, when an LT substrate having a cut angle θ of 30° to 48° is used as the pyroelectric substrate 120, the pyroelectric element 10 can be manufactured using a 4-inch-diameter LT substrate obtained by slicing a 4-inch-diameter single crystal at right angles to the pull-up direction. A Z-plate (θ=90°) is manufactured using an LT substrate obtained by slicing a 4-inch-diameter single crystal diagonally to the pull-up direction. In this case, the diameter of the LT substrate is reduced to about 3 inches.

Second Embodiment

Figure 6:
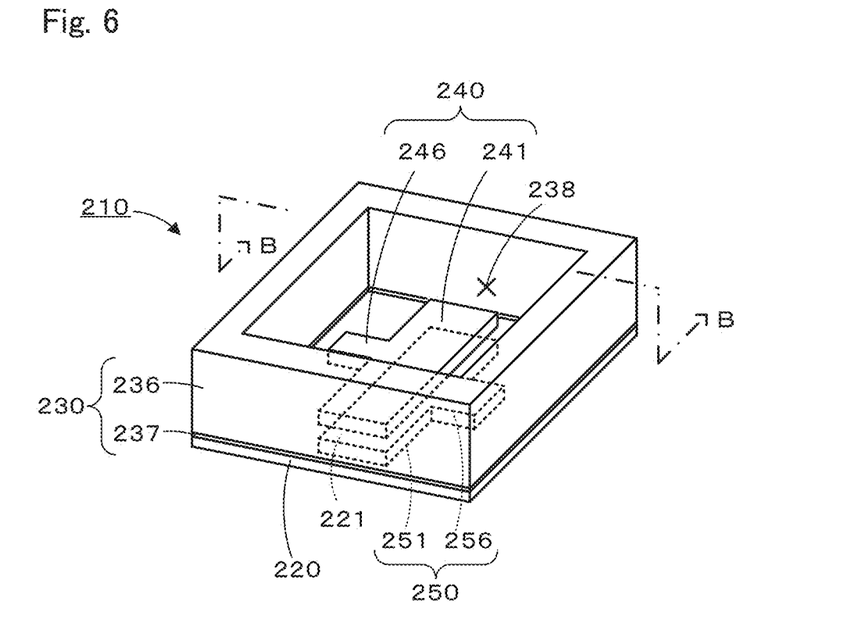
FIG. 6 is a schematic perspective view of a pyroelectric element 210 according to a second embodiment.
Figure 7:
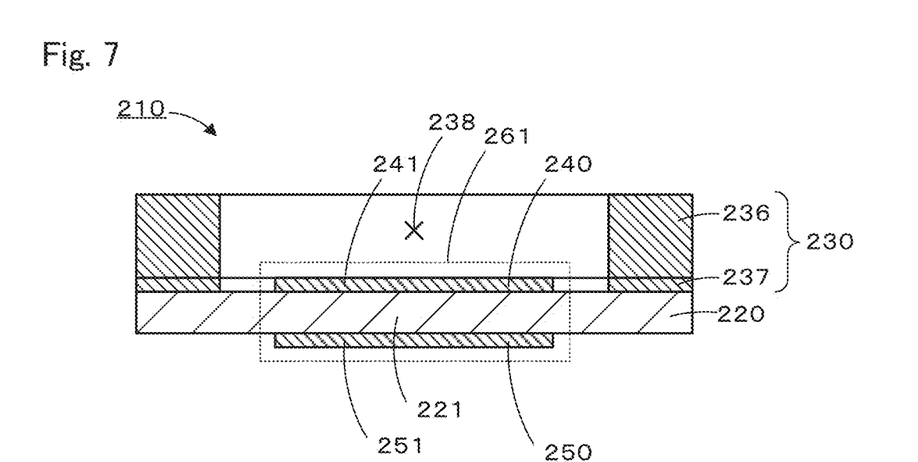
FIG. 7 is a cross-sectional view taken along line B-B of FIG. 6.

FIG. 6 is a schematic perspective view of a pyroelectric element 210 according to a second embodiment. FIG. 7 is a cross-sectional view taken along line B-B of FIG. 6.

The pyroelectric element 210 is configured as a single-type pyroelectric element that includes one light-receiving section 261 (see FIG. 7). The pyroelectric element 210 includes a pyroelectric substrate 220, a supporting member 230 configured to support the pyroelectric substrate 220, a front-side metal layer 240 disposed on a front side of the pyroelectric substrate 220, and a back-side metal layer 250 disposed on a back side of the pyroelectric substrate 220.

The pyroelectric substrate 220 is a Y-offcut plate of LT single crystal and has a cut angle θ of 30° to 60° or 120° to 150°. The thickness of the pyroelectric substrate 220 is 10 µm or less (e.g., 1 µm to 10 µm) and preferably 5 µm to 10 µm. The pyroelectric substrate 220 will not be described in detail here, as it is the same as the pyroelectric substrate 20 of the first embodiment.

The supporting member 230 includes a supporting substrate 236 and a bonding layer 237. The supporting substrate 236 is a rectangular frame-like member having an internal cavity 238. The supporting substrate 236 is formed on the front side of the pyroelectric substrate 220 to support the pyroelectric substrate 220. Examples of the material of the supporting substrate 236 include glass, LT, and LN. The size of the supporting substrate 236 is not particularly limited, but is, for example, 0.1 mm to 5 mm in length, 0.1 mm to 5 mm in width, and 0.15 mm to 5 mm in thickness. The bonding layer 237 is configured to bond the supporting substrate 236 to the pyroelectric substrate 220. Examples of the material of the bonding layer 237 include a hardened epoxy adhesive and a hardened acrylic adhesive. The thickness of the bonding layer 237 is not particularly limited, but is, for example, 0.1 µm to 1 µm. Besides the adhesive, direct bonding, such as anode bonding and surface activation, may be used as a bonding method. The supporting substrate 236 and the bonding layer 237 are preferably made of materials having thermal conductivities lower than that of the material of the pyroelectric substrate 220.

The front-side metal layer 240 is formed on the front side of the pyroelectric substrate 220. The front-side metal layer 240 includes a rectangular front-side electrode 241 longitudinally extending in plan view and a lead portion 246 electrically connected to the front-side electrode 241. The back-side metal layer 250 is formed on the back side of the pyroelectric substrate 220 and located opposite the front-side metal layer 240. The back-side metal layer 250 includes a rectangular back-side electrode 251 longitudinally extending in plan view and a lead portion 256 electrically connected to the back-side electrode 251. The material and the thickness of the front-side metal layer 240 and the back-side metal layer 250 will not be described here, as they are the same as those of the front-side metal layer 40 and the back-side metal layer 50 of the first embodiment.

The light-receiving section 261 is formed by a pair of electrodes (front-side electrode 241 and back-side electrode 251) and a light-receiving portion 221 of the pyroelectric substrate 220 interposed between the front-side electrode 241 and the back-side electrode 251. In the light-receiving section 261, a voltage between the pair of electrodes changes when the temperature is changed by irradiation of infrared light. For example, when the front side of the light-receiving section 261 is irradiated with infrared light, the front-side electrode 241 and the light-receiving portion 221 absorb the infrared light. This causes a change in temperature. Then, the resulting change in spontaneous polarization in the light-receiving portion 221 appears as a change in voltage between the front-side electrode 241 and the back-side electrode 251.

If back-side electrodes 251 of two pyroelectric elements 210 are electrically connected to each other and lead wires are attached to respective front-side electrodes 241, a configuration substantially the same as that of the pyroelectric element 10 of the first embodiment is realized. This means that the two pyroelectric elements 210 operate in a manner similar to that of the pyroelectric element 10 of the first embodiment. The operation of the pyroelectric element 210 configured as described above thus will not be described here.

In the pyroelectric element 210 described in detail above, a Y-offcut plate made of LT single crystal and having a cut angle θ of 30° to 60° or 120° to 150° is used as the pyroelectric substrate 220. Therefore, it is possible to suppress the occurrence of popcorn noise and the degradation in S/N ratio. At the same time, since the thickness of the Y-offcut plate is 10 µm or less (e.g., 1 µm to 10 µm), it is possible to further improve the S/N ratio. A large-sized Y-offcut plate which is 4 inches in diameter can be used here.

It will be obvious that the present invention is not limited to the embodiments described above, and may be implemented in various ways within the technical scope of the present invention.

For example, although the cavities 38 and 238 are rectangularly surrounded by the supporting layers 32 and the supporting substrate 236, respectively, in the first and second embodiments described above, the cavities 38 and 238 may be of any shape. For example, the cavities 38 and 238 may be circularly surrounded by the supporting layers 32 and the supporting substrate 236, or may not be completely surrounded by the supporting layers 32 and the supporting substrate 236 and may partially face the peripheries of the pyroelectric elements 10 and 210, respectively.

The pyroelectric element 10 of the first embodiment is of dual type and the pyroelectric element 210 of the second embodiment is of single type, as described above. However, the pyroelectric element 10 may be of single type or quad type, and the pyroelectric element 210 may be of dual type or quad type. The configurations of front-side and back-side electrodes of a quad-type pyroelectric element are described, for example, in Japanese Unexamined Patent Application Publication No. 2006-203009.

EXAMPLES

Example 1

Figure 8:
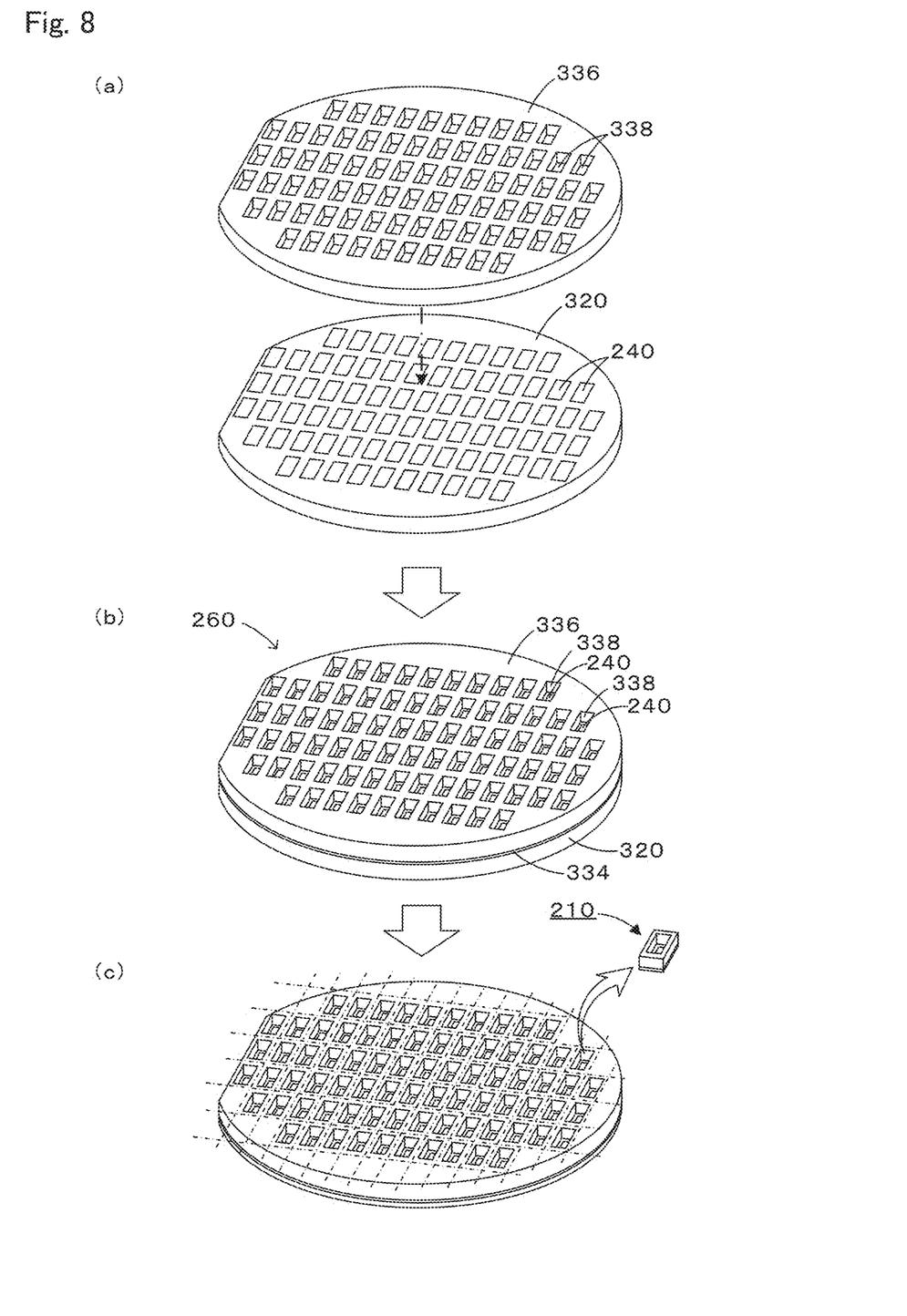
FIG. 8 illustrates a procedure of making the pyroelectric element 210 of the second embodiment.

The pyroelectric element 210 of the second embodiment was made in Example 1. FIG. 8 illustrates a procedure of making the pyroelectric element 210.

First, an LT substrate 320 having an OF portion was prepared. The LT substrate 320 is 4 inches in diameter and 350 µm in thickness. A 48° Y-offcut plate (having a cut angle θ of 48°) was used as the LT substrate 320. The LT substrate 320 is one which is to be divided into pyroelectric substrates 220 by dicing. Next, many front-side metal layers 240 of nickel and chromium were formed on the front side of the LT substrate 320 (see FIG. 8(a)). The front-side metal layers 240 were formed by vacuum evaporation using a metal mask that covers the LT substrate 320 except for areas of the front-side metal layers 240. The vacuum evaporation first involved depositing a chromium film at a rate of 5 Å/s until a thickness of 0.02 µm was reached, and depositing a nickel film at a rate of 10 Å/s until a thickness of 0.1 µm was reached. The pressure during film deposition in the vacuum evaporation was $2.7 \times 10^{-4}$ Pa, and the temperature of the LT substrate 320 was about 100° C. Thus, the front-side metal layers 240 having a thickness of 0.12 µm were formed. The pattern of the front-side metal layers 240 was formed such that each front-side electrode 241 was 2 mm in length and 2 mm in width, and that each lead portion 246 was 0.1 mm in length and 2 mm in width.

Next, a glass substrate 336 having an OF portion was prepared. The glass substrate 336 is 4 inches in diameter and 500 µm in thickness. Many rectangular holes 338, each having a length of 3 mm and a width of 3 mm, were formed by water-jet machining (see FIG. 8(a)). The glass substrate 336 is one which is to be divided into the supporting substrates 236 by dicing, and the rectangular holes 338 are ones which are to be separated into individual cavities 238 by dicing.

Next, a 1-µm-thick coating of epoxy adhesive was applied to the front side of the LT substrate 320. The LT substrate 320 was aligned with and bonded to the glass substrate 336 such that the front-side metal layers 240 were inserted into the respective rectangular holes 338 of the glass substrate 336. After the thickness of the epoxy adhesive was reduced to 0.1 µm by press bonding, the LT substrate 320 bonded to the glass substrate 336 was left for one hour at a temperature of 200° C. The epoxy adhesive was thus cured to form a bonding layer 334, and a composite body 260 was obtained (see FIG. 8(b)). The bonding layer 334 is one which is to be divided into bonding layers 237 by dicing. Then, the adhesive attached to the front-side metal layer 240 was removed by sputtering using Ar ions.

Next, the composite body 260 was turned upside down. The glass substrate 336 was secured by bonding to a grinding jig of silicon carbide. A side of the LT substrate 320 not covered by the glass substrate 336 was ground by a grinder with fixed abrasive grains until the thickness of the LT substrate 320 reached 50 µm. This side was further ground with diamond abrasive grains until the thickness of the LT substrate 320 reached 12 µm. Then, this side was subjected to final grinding, using loose abrasive grains and a non-woven grinding pad, until the thickness of the LT substrate 320 reached 10 µm. Note that the final grinding was performed to remove an affected layer formed on the LT substrate 320 by grinding with diamond abrasive grains.

After the LT substrate 320 was ground as described above, many back-side metal layers 250 (see FIG. 6 and FIG. 7) were formed on the back side of the LT substrate 320 (i.e., on a side where no front-side metal layers 240 are formed). This process was carried out using the same materials and under the same conditions as those for forming the front-side metal layers 240. The pattern of the back-side metal layers 250 was formed such that each back-side electrode 251 was 2 mm in length and 2 mm in width, and that each lead portion 256 was 0.5 mm in length and 2 mm in width. After the formation of the back-side metal layers 250, the pyroelectric elements 210 each having a length of 3.5 mm and a width of 3.5 mm were cut out of the composite body by dicing (see FIG. 8(c)). Dot-and-dash lines in FIG. 8(c) indicate cut lines for dicing. In each of the resulting pyroelectric elements 210, the pyroelectric substrate 220 is a 10-µm-thick Y-offcut plate made of LT single crystal and having a cut angle θ of 48°.

Examples 2 to 6

Comparative Examples 1 to 4

The pyroelectric elements 210 of Examples 2 to 6 and Comparative Examples 1 to 4 were made in accordance with the procedure of Example 1. The cut angle θ and the thickness of the pyroelectric substrate 120 of each of the pyroelectric elements 210 are as shown in Table 1.

[Evaluation Test]

The popcorn noise, voltage sensitivity, S/N ratio, and thermal time constant of the pyroelectric element 210 of each of Examples and Comparative Examples were measured.

(1) Measurement of Popcorn Noise

Figure 9:
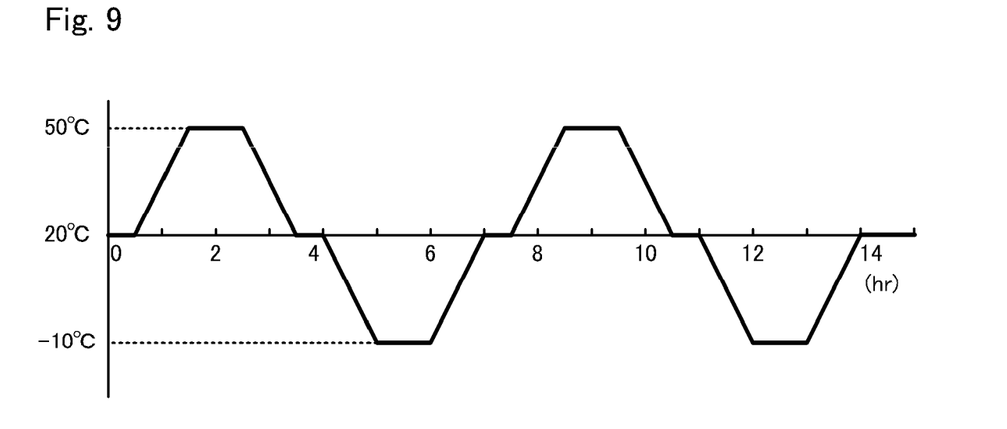
FIG. 9 illustrates a heat cycle carried out in the measurement of popcorn noise.

A heat cycle test was performed on each of the pyroelectric elements 210 to determine the occurrence of popcorn noise. The heat cycle test was performed in the following procedure. After each pyroelectric element 210 was placed in an environment tester, the temperature in the environment tester was periodically changed from −10° C. to 50° C. Specifically, the temperature was changed as shown in FIG. 9. Then, the heat cycle test was performed for 15 hours to determine whether there was the occurrence of sudden large output (popcorn noise). The result is shown in Table 1.

(2) Measurement of Voltage Sensitivity Rv and S/N Ratio

Figure 10:
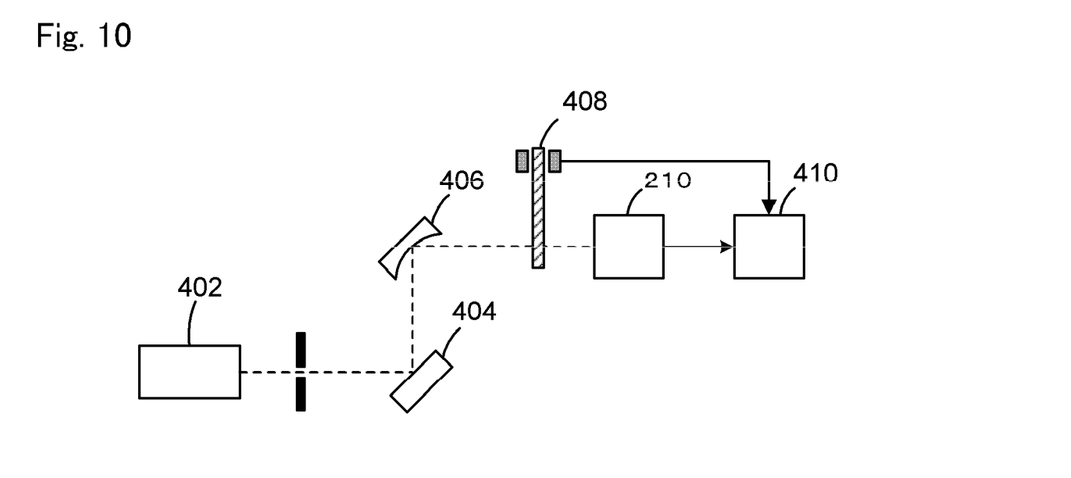
FIG. 10 illustrates an experimental system that measures voltage sensitivities and S/N ratios.

Voltage sensitivities Rv and S/N ratios were measured in an experimental system illustrated in FIG. 10. In this experimental system, infrared light emitted from a blackbody radiator 402 to the pyroelectric element 210 was aligned using a plane wave mirror 404 and a concave mirror 406. The infrared light was passed through a chopper 408 and concentrated in a window area of the light-receiving section 261 of the pyroelectric element 210. The area of the light-receiving section 261 of the pyroelectric element 210 is 2 mm by 2 mm. The input infrared light was chopped by the chopper 408 at a frequency of 10 Hz and applied to the pyroelectric element 210. The voltage sensitivity Rv of the pyroelectric element 210 was measured by a lock-in amplifier 410. An input impedance of a voltage converting circuit in the lock-in amplifier 410 was set to $10^{11} \Omega$. The voltage sensitivity Rv of each pyroelectric element 210 is shown in Table 1.

Next, a noise voltage Vn was detected when there was no input infrared light was measured. Main noise components were temperature noise, tan δ noise, and input impedance noise. From these measured values, the S/N ratio was calculated by the following equation:

$$S/N = A^{0.5} \times Rv/Vn$$

where A is the light-receiving area of the pyroelectric element 210. The S/N ratio of each pyroelectric element 210 is shown in Table 1.

(3) Measurement of Thermal Time Constant

The thermal time constant or rising time of each pyroelectric element 210 was measured. Specifically, first, the pyroelectric element 210 was placed at a distance of 50 cm from a 600-K blackbody furnace. Next, infrared light was applied to the pyroelectric element 210 and the output was recorded by a digital oscilloscope. The time taken from 10% to 90% of an output peak value was calculated and the calculated time was defined as a thermal time constant. The thermal time constant of each pyroelectric element 210 is shown in Table 1.

TABLE 1

|  | Pyroelectric substrate (LT substrate) | Cut angle θ (°) | Thickness of substrate (μm) | Popcorn noise | Voltage Sensitivity Rv (V/W) | S/N ratio (cm √Hz/W) | Thermal time constant (sec) |
|---|---|---|---|---|---|---|---|
| Example 1 | Y-offcut plate | 48 | 10 | Not detected | 350 | $8.3 \times 10^8$ | 0.08 |
| Example 2 | Y-offcut plate | 48 | 5 | Not detected | 320 | $10.5 \times 10^8$ | 0.04 |
| Example 3 | Y-offcut plate | 30 | 10 | Not detected | 240 | $6.3 \times 10^8$ | 0.08 |
| Example 4 | Y-offcut plate | 60 | 10 | Not detected | 230 | $4.1 \times 10^8$ | 0.08 |
| Example 5 | Y-offcut plate | 48 | 20 | Not detected | 360 | $5.5 \times 10^8$ | 0.17 |
| Example 6 | Y-offcut plate | 48 | 40 | Not detected | 360 | $3.1 \times 10^8$ | 0.34 |
| Comparative example 1 | Y-offcut plate | 20 | 10 | Not detected | 160 | $3.9 \times 10^8$ | 0.08 |
| Comparative example 2 | Y-offcut plate | 65 | 10 | detected | 190 | $4.0 \times 10^8$ | 0.08 |
| Comparative example 3 | Z-plate | 90 | 10 | detected | 440 | $9.8 \times 10^8$ | 0.08 |
| Comparative example 4 | Z-plate | 90 | 40 | detected | 450 | $4.1 \times 10^8$ | 0.43 |

(4) Evaluation

As is apparent from Table 1, no popcorn noise occurred in Examples 1 to 6 where a Y-offcut plate having a cut angle θ of 30° to 60° was used. On the other hand, popcorn noise occurred in Comparative Examples 2 to 4 where a Y-offcut plate having a cut angle θ of 65° or a Z-plate was used.

In Examples 1, 3, and 4 where a 10-μm-thick Y-offcut plate was used, the S/N ratio was 40% or more of that in Comparative Example 3 where a Z-plate of the same thickness was used, and there was only a small degradation in S/N ratio caused by the use of a Y-offcut plate. In Example 6 where a 40-μm-thick Y-offcut plate was used, the S/N ratio was 75% or more of that in Comparative Example 4 where a Z-plate of the same thickness was used, and again there was only a small degradation in S/N ratio caused by the use of a Y-offcut plate. In Examples 1, 2, and 6 where a Y-offcut plate having a cut angle θ of 48° was used, the smaller the substrate thickness, the greater the S/N ratio. On the other hand, in Comparative Example 1 where a Y-offcut plate having a cut angle θ of 20° was used, although there was no occurrence of popcorn noise, the S/N ratio was 40% or less of that in Comparative Example 3 where a Z-plate of the same thickness was used. Note that the thermal time constant (responsiveness) did not depend on the cut angle θ, but depended on the thickness of the LT substrate.

Thus, it has been found that if a Y-offcut plate having a cut angle θ of 30° to 60° is used as the pyroelectric substrate 120, it is possible to suppress not only the occurrence of popcorn noise, but also the degradation in S/N ratio. It has also been found that the S/N ratio can be further improved if the thickness of the Y-offcut plate is 10 μm or less (e.g., 1 μm to 10 μm).

This application is based on and claims priority from U.S. provisional patent application No. 61/469,885 filed on Mar. 31, 2011, and Japanese Patent Application No. 2011-37850 filed on Feb. 24, 2011, which are hereby incorporated by reference herein in its entirety.

Industrial Applicability

The pyroelectric element of the present invention can be used, for example, as an infrared sensor for security or gas detection purposes.

The invention claimed is:

1. A pyroelectric element comprising:
a pyroelectric substrate being a substrate of lithium tantalate single crystal having an X-axis, a Y-axis, and a Z-axis as crystal axes; and
a pair of electrodes disposed on front and back sides of the pyroelectric substrate,
wherein the pyroelectric substrate is a Y-offcut plate obtained by cutting the lithium tantalate single crystal at an angle turned by a cut angle θ from the Y-axis toward the Z-axis about the X-axis that coincides with a direction along the electrode plane, and the cut angle θ is 30° to 60° or 120° to 150°.

2. The pyroelectric element according to claim 1, wherein the Y-offcut plate is 10 μm or less in thickness.

3. The pyroelectric element according to claim 2, wherein the Y-offcut plate is 5 μm to 10 μm in thickness.

* * * * *